United States Patent
Toyama

(10) Patent No.: US 8,446,768 B2
(45) Date of Patent: May 21, 2013

(54) CONTROL DEVICE FOR NONVOLATILE MEMORY AND METHOD OF OPERATING CONTROL DEVICE

(75) Inventor: Shunichi Toyama, Yokohama (JP)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 123 days.

(21) Appl. No.: 12/914,131

(22) Filed: Oct. 28, 2010

(65) Prior Publication Data

US 2011/0157990 A1    Jun. 30, 2011

(30) Foreign Application Priority Data

Dec. 24, 2009  (JP) ................................. 2009-293100
Mar. 30, 2010  (KR) ........................ 10-2010-0028657

(51) Int. Cl.
  *G11C 16/04*  (2006.01)
(52) U.S. Cl.
  USPC ............ 365/185.17; 365/185.18; 365/185.19; 365/185.22
(58) Field of Classification Search
  USPC .............. 365/185.17, 185.18, 185.19, 185.22
  See application file for complete search history.

(56) References Cited

U.S. PATENT DOCUMENTS

| | | | | |
|---|---|---|---|---|
| 5,172,339 A | * | 12/1992 | Noguchi et al. | 365/201 |
| 6,567,306 B2 | * | 5/2003 | Lee | 365/185.11 |
| 6,661,710 B2 | * | 12/2003 | Kwon | 365/185.24 |
| 6,862,213 B2 | * | 3/2005 | Hamaguchi | 365/158 |
| 7,352,630 B2 | * | 4/2008 | Lee et al. | 365/185.22 |
| 7,433,240 B2 | * | 10/2008 | Kim | 365/185.23 |

FOREIGN PATENT DOCUMENTS

| | | |
|---|---|---|
| JP | 05089687 A | 4/1993 |
| JP | 08306192 A | 11/1996 |
| JP | 2003007074 A | 1/2003 |
| WO | 0161503 A1 | 8/2001 |

* cited by examiner

*Primary Examiner* — Pho M Luu
(74) *Attorney, Agent, or Firm* — Volentine & Whitt, PLLC

(57) ABSTRACT

A device comprises a nonvolatile memory cell array, a buffer circuit, a program control circuit, and a read control circuit. The nonvolatile memory cell array comprises a plurality of memory cells. The program control circuit stores program data in the buffer circuit. The read control circuit reads data from a selected address of the nonvolatile memory cell array. The program control circuit compares the program data with the read data, and sets a bit of the program data as a program-inhibit bit based on the comparison.

20 Claims, 3 Drawing Sheets

CONTROL DEVICE FOR NONVOLATILE MEMORY AND METHOD OF OPERATING CONTROL DEVICE

CROSS-REFERENCE TO RELATED APPLICATIONS

This application claims priority under 35 U.S.C. §119 to Korean Patent Application No. 10-2010-0028657 filed on Mar. 30, 2010 and Japanese Patent Application No. 2009-293100 filed on Dec. 24, 2009, the respective disclosures of which are hereby incorporated by reference in their entirety.

BACKGROUND

Embodiments of the inventive concept relate generally to semiconductor memory devices. More particularly, embodiments of the inventive concept relate to control devices for nonvolatile memory devices and methods of operating the control devices.

Semiconductor memory devices play a significant role in a wide variety of consumer and industrial technologies, ranging from home computers to satellite equipment. Consequently, improvements in semiconductor memory technology can have a significant impact on the performance of numerous technical applications.

Semiconductor memory devices can be roughly divided into two categories based on whether or not they retain stored data when disconnected from power. These categories include volatile memory devices, which lose stored data when disconnected from power, and nonvolatile memory devices, which retain stored data when disconnected from power. Examples of volatile memory devices include dynamic random access memory (DRAM) and static random access memory (SRAM), and examples of nonvolatile memory devices include read only memory (ROM), ferroelectric random access memory (FeRAM), phase-change random access memory (PRAM), and flash memory.

Flash memory has become an especially popular form of nonvolatile memory due to its relatively low cost, low power consumption, high integration density, and ability to withstand physical shock. At the same time, however, flash memory still suffers from various shortcomings.

One shortcoming of flash memory is that it tends to wear out after a certain number of erase or program operations are performed. In other words, flash memory has limited erase or program endurance. This limitation is a consequence of the way that flash memory cells are programmed and erased. In particular, in an erase or program operation of a flash memory, a relatively large electrical field is created between a channel region and a floating gate of a selected flash memory cell. The electrical field causes electrons to cross an insulating region of the floating gate to change the selected flash memory cell from an erased state to a programmed state or vice versa. The passage of electrons places stress on the insulating region, which can cause it to break down or leak charges after a large number of program or erase operations are performed.

Another shortcoming of flash memory is that it can lose stored data with the mere passage of time. For instance, where a flash memory cell remains programmed for a long period, such as ten years, electrical charges can diffuse away from its floating gate, resulting in lost data. To address this shortcoming, a data retention operation may be performed by reading stored data from memory cells that were previously programmed, and adjusting the threshold voltages of the memory cells to account for any lost charges. The data retention operation, however, can add stress to the insulating layer of the memory cells, similar to program and erase operations.

SUMMARY

Embodiments of the inventive concept provide control devices for nonvolatile memory devices, and methods of operating the control devices. In certain embodiments, the control devices and methods reduce the number of program operations performed on a nonvolatile memory. This can improve both the lifetime and the performance of the nonvolatile memory.

According to one embodiment of the inventive concept, a device comprises a nonvolatile memory cell array comprising a plurality of memory cells, a buffer circuit, a read control circuit that reads data from a selected address of the nonvolatile memory cell array and transfers the read data from the buffer circuit, a program control circuit that stores program data in the buffer circuit, compares the program data with the read data, and sets a bit of the program data as a program-inhibit bit based on the comparison.

In certain embodiments, the program control circuit sets the bit of the program data as a program-inhibit bit upon detecting that a corresponding bit of the read data has a state corresponding to a programmed memory cell.

In certain embodiments, the program control circuit performs a program operation to store the program data at the selected address of the nonvolatile memory cell array after setting the bit of the program data as the program-inhibit bit.

In certain embodiments, the program-inhibit bit corresponds to a logical '1'.

In certain embodiments, the read control circuit reads data from the nonvolatile memory cell array while the program control circuit stores the program data in the buffer circuit.

In certain embodiments, the program control circuit disables a program voltage corresponding to the program-inhibit bit in the program operation.

In certain embodiments, the device further comprises a verify control circuit that reads the program data from the selected address to determine whether the program data is successfully stored in the selected address.

In certain embodiments, the verify control circuit reads the program data from the selected address using a voltage higher than a read voltage used in normal read operations of the nonvolatile memory cell array.

In certain embodiments, the program operation is performed using incremental step pulse programming.

According to another embodiment of the inventive concept, a device comprises a read control circuit that reads data from a selected address of a nonvolatile memory cell array and stores the read data in a buffer, and a program control circuit that stores program data in the buffer while the read control circuit reads the read data from the nonvolatile memory cell array, compares the program data stored in the buffer with the read data stored in the buffer, and changes a bit of the program data to a program-inhibit bit based on the comparison.

In certain embodiments, the device further comprises a verify control circuit that performs a verify read operation to verify whether the data stored at the selected address matches the program data, and causes the program control circuit to program the program data to the selected address upon determining that the data stored at the selected address does not match the program data.

In certain embodiments, the verify control circuit reads the written program data with a verification voltage higher than a read voltage used in normal read operations of the nonvolatile memory cell array.

In certain embodiments, the nonvolatile memory cell array is a NAND flash memory cell array.

According to another embodiment of the inventive concept, a method of operating a control device for a nonvolatile memory device comprises reading data from a selected address of a nonvolatile memory cell array and storing the read data in a buffer, storing program data in the buffer while the data is read from the nonvolatile memory cell array, setting a bit of the program data as a program-inhibit bit upon detecting that the bit has a different value from a corresponding bit of the read data, and performing a program operation to store the program data having the program-inhibit bit at the selected address of the nonvolatile memory cell array.

In certain embodiments, the method further comprises reading the program data from the nonvolatile memory cell array, inhibiting further programming of bits of the program data that have been successfully programmed at the selected address, and further programming bits of the program data that have not been successfully programmed at the selected address.

In certain embodiments, reading the program data from the nonvolatile memory cell array comprises applying a verification read voltage to selected memory cells of the nonvolatile memory cell array, wherein the verification read voltage is higher than a read voltage applied to the selected memory cells during normal read operations of the nonvolatile memory cell array.

In certain embodiments, the program data is stored in the nonvolatile memory cell array using an incremental step pulse programming operation.

In certain embodiments, the nonvolatile memory cell array is a NAND flash memory device.

In certain embodiments, the method further comprises incrementing the selected address, storing additional program data in the buffer, reading additional data from the nonvolatile memory cell array at the incremented address, comparing the additional read data to the additional program data, and changing a bit of the additional program data to a program-inhibit bit based on the comparison.

In certain embodiments, the program-inhibit bit is a logical '1'.

BRIEF DESCRIPTION OF THE DRAWINGS

The drawings illustrate selected embodiments of the inventive concept. In the drawings, like reference numbers indicate like features.

DETAILED DESCRIPTION OF EMBODIMENTS

Embodiments of the inventive concept are described below with reference to the accompanying drawings. These embodiments are presented as teaching examples and should not be construed to limit the scope of the inventive concept.

In certain embodiments, a nonvolatile memory device comprises a control device that programs selected memory cells based on a comparison between read data obtained from the selected memory cells, and program data received by the control device. The control device reads the read data from the selected memory cells and compares it with the program data. Where the read data indicates that one of the selected memory cells is already programmed to a state indicated by a corresponding bit of the program data, the selected memory cell is not further programmed. Otherwise, where the existing data indicates that one of the selected memory cells is not currently programmed to a state indicated by a corresponding bit of the program data, the selected memory cell is programmed according to the program data.

In certain embodiments, the control device reads the existing data from the selected memory cells using read voltages that are higher than read voltages used in ordinary read operations. The control device also programs the program data into the selected memory cells using verification read voltages that are higher than the read voltages used in ordinary read operations. By using the higher read voltages and read verification voltages, the control device counteracts charge leakage and other influences that may lower the threshold voltages of the selected memory cells over time.

By omitting program operations of selected memory cells that are already programmed to a desired state, the control device reduces stress on some memory cells, which can extend the lifetime of the selected memory cells.

Figure 1:
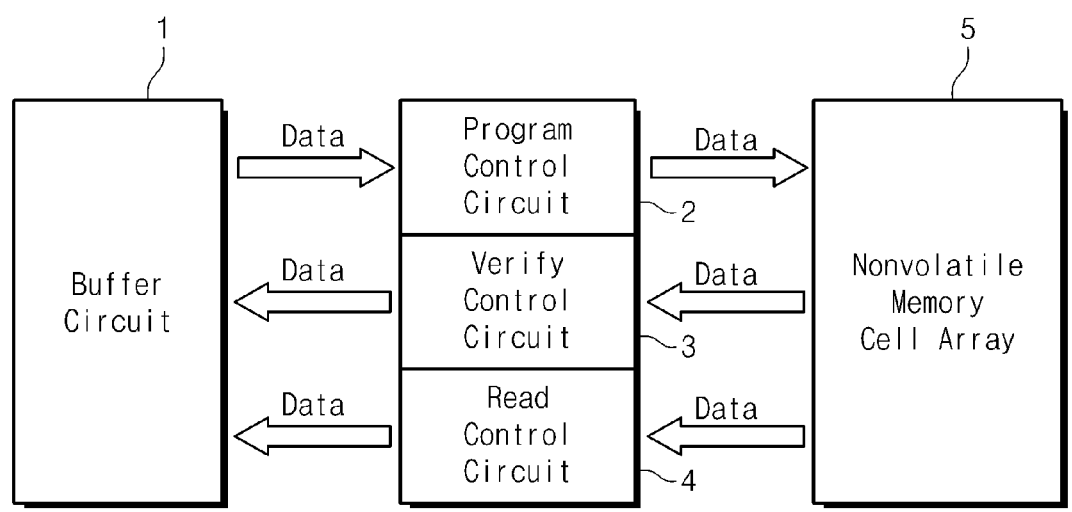
FIG. 1 is a diagram illustrating a control device for a nonvolatile memory device according to an embodiment of the inventive concept.

FIG. 1 is a diagram illustrating a control device of a nonvolatile memory device according to an embodiment of the inventive concept.

Referring to FIG. 1, the control device comprises a buffer circuit 1, a program control circuit 2, a verify control circuit 3, and a read control circuit 4. The control device is connected to a nonvolatile memory cell array 5.

Nonvolatile memory cell array 5 comprises a plurality of memory cells. In certain embodiments, nonvolatile memory cell array 5 programs data in word units, such as 8-bit words, 16-bit words, 24-bit words, etc. Nonvolatile memory cell array 5 could also program data in other units, such as page units. For explanation purposes, it will be assumed that the memory cells of nonvolatile memory cell array 5 are single level cells storing one bit each. However, they could also be multi-level cells storing two or more bits each.

Program control circuit 2 controls program operations of nonvolatile memory cell array 5. Program control circuit 2 receives program data to be programmed in selected memory cells of program control circuit 2 and performs a program operation based on the received program data.

Verify control circuit 3 controls program verification operations to determine a current state of the selected memory cells.

Read control circuit 4 controls read operations of nonvolatile memory cell array 5.

Buffer circuit 1 temporarily stores program data to be programmed in selected memory cells of nonvolatile memory cell array 5 by program control circuit 2. Buffer circuit 1 also temporarily stores existing data that is stored in the selected memory cells of nonvolatile memory cell array 5 and is read by verify control circuit 3 or read control circuit 4.

Figure 2:
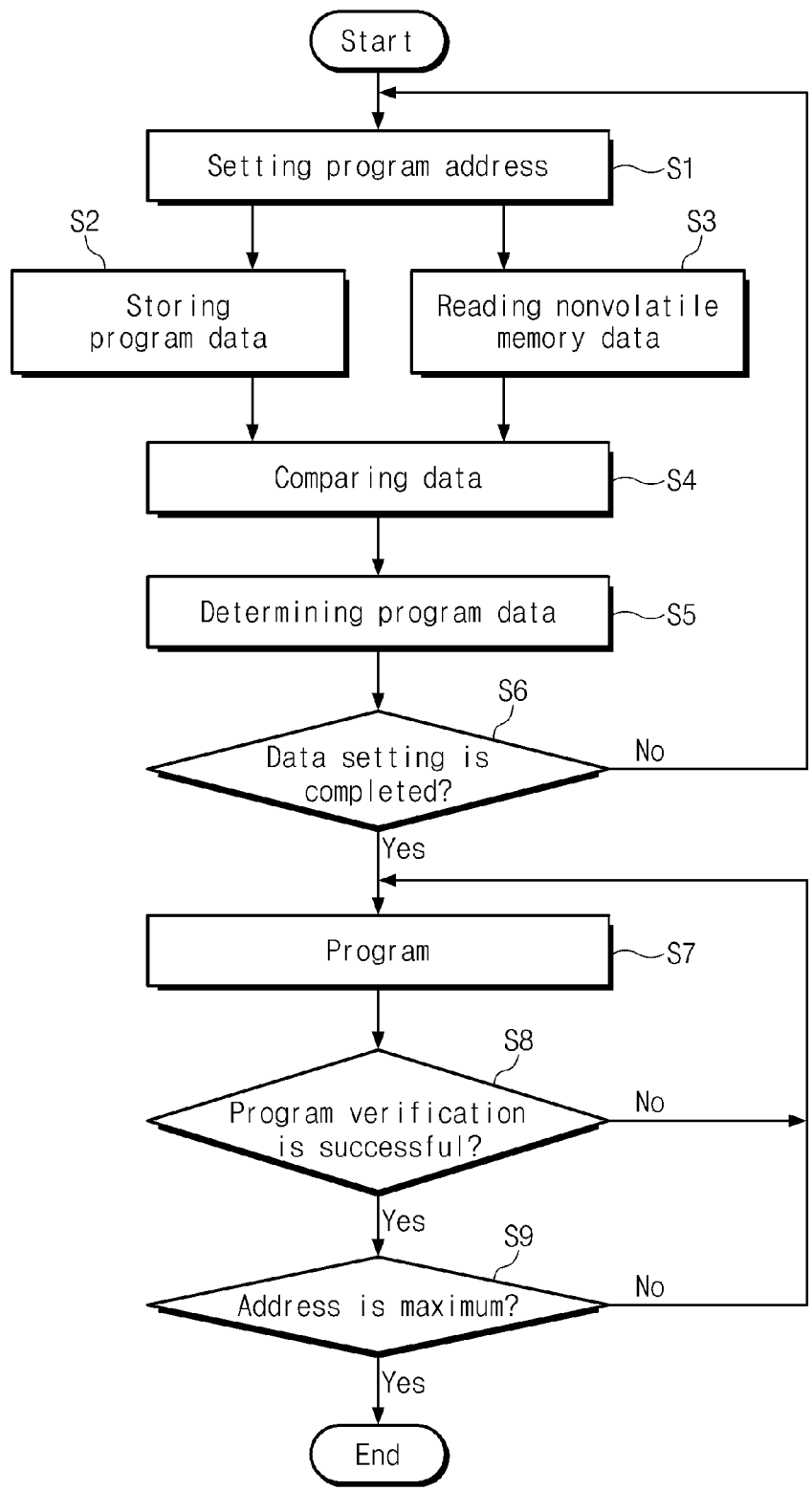
FIG. 2 is a flowchart illustrating the operation of the control device of FIG. 1 according to an embodiment of the inventive concept.

FIG. 2 is a flowchart illustrating the operation of the control device of FIG. 1 according to an embodiment of the inventive concept.

Referring to FIG. 2, the control device receives a program command comprising a program address and program data. The program address indicates a location of selected memory cells in nonvolatile memory cell array 5 where the program data is to be stored. The program command can further comprise information indicating a size of the program data. The program command or program data can be provided from another memory device that is connected to a bus of the control device.

In the example of FIG. 2, the program data is received in a plurality of units, and the program address is incremented or otherwise modified to identify different locations of nonvolatile memory cell array 5 where subsequent units of program data are to be stored.

In an operation S1, program control circuit 2 receives the program address and sets the program address as an initial address for storing the program data. Following operation S6 below, the program address may be modified (e.g., by incrementing) to store successive units (e.g., words) of the program data in different locations of nonvolatile memory cell array 5.

In an operation S2, program control circuit 2 stores a unit of the program data in buffer circuit 1.

In an operation S3 performed concurrently with operation S2, read control circuit 4 accesses nonvolatile memory cell array 5 and reads data from the program address set in operation S1. Read control circuit 4 transmits the read data to buffer circuit 1.

To perform operations S2 and S3 concurrently, buffer circuit 1 can comprise a memory device "A" corresponding to program control circuit 2, and a memory device "B" corresponding to verify control circuit 3 and read control circuit 4. In some embodiments, the control device comprises a switch to allow program control circuit 2 to access memory device "B" (e.g., in an operation S4 below). In some embodiments, the control device also comprises a switch for allowing verify control circuit 3 to access memory device "A" (e.g., in operations S7 and S8 below).

In an operation S4, the control circuit compares the read data in buffer circuit 1 with the program data in buffer 1 on a bit-by-bit basis.

In an operation S5, the control device modifies the program data according to the comparison performed in operation S4. In particular, where a bit of the read data is a '0', a corresponding bit of the program data is changed to a '1'. Where the program data is changed to a '1', a program voltage is not applied to a corresponding memory cell in a subsequent program operation of nonvolatile memory device 5.

In an operation S6, the control device determines whether operations S1 through S5 have been completed for all of the program data indicated by the program command. If not (S6=No), the program address is modified and operations S1 through S5 are performed with respect to an additional unit of program data corresponding to the modified program address.

In an operation S7, program control circuit 2 programs the program data stored in buffer circuit 1 into nonvolatile memory cell array 5. More specifically, program control circuit 2 applies a program voltage to selected memory cells corresponding to '0' of the program data. The program data is typically programmed using the same units that they were stored in buffer circuit 1. For instance, where the program data is stored in buffer circuit 1 in words having program addresses that are incremented from the initial address, the program data is programmed into nonvolatile memory cell array 5 using the same units. Accordingly, to perform the program operation, the program address can be reset to the initial address and incremented from there until it reaches a maximum value, as detected in operation S9 below.

In an operation S8, verify control circuit 3 performs a verification read operation to read selected memory cells that were programmed in operation S7 to determine whether they have been successfully programmed. The verification read operation is performed with a verification voltage higher than a normal read voltage used in normal read operations. Verify control circuit 3 then transmits the data to read buffer circuit 1. By performing a read operation with a verification voltage higher than the read voltage, threshold voltages of the selected memory cells are set higher than the normal read voltage, which can improve data retention.

Upon successfully programming a bit program data in nonvolatile memory cell array 5, the bit of data can be changed to a '1' in buffer circuit 1. Once all of the bits in a unit of program data of buffer circuit 1 have been successfully programmed (S8=Yes), the unit of program data can be erased. Otherwise (S8=No), program control circuit 2 can repeat operation S7.

In an operation S9, the control device determines whether all of units of the program data have been successfully programmed in nonvolatile memory cell array 5. If not (S9=No), the program address is modified or incremented, and operations S7 through S9 are repeated on another unit of the program data. Otherwise (S9=Yes), the method terminates.

Figure 3:
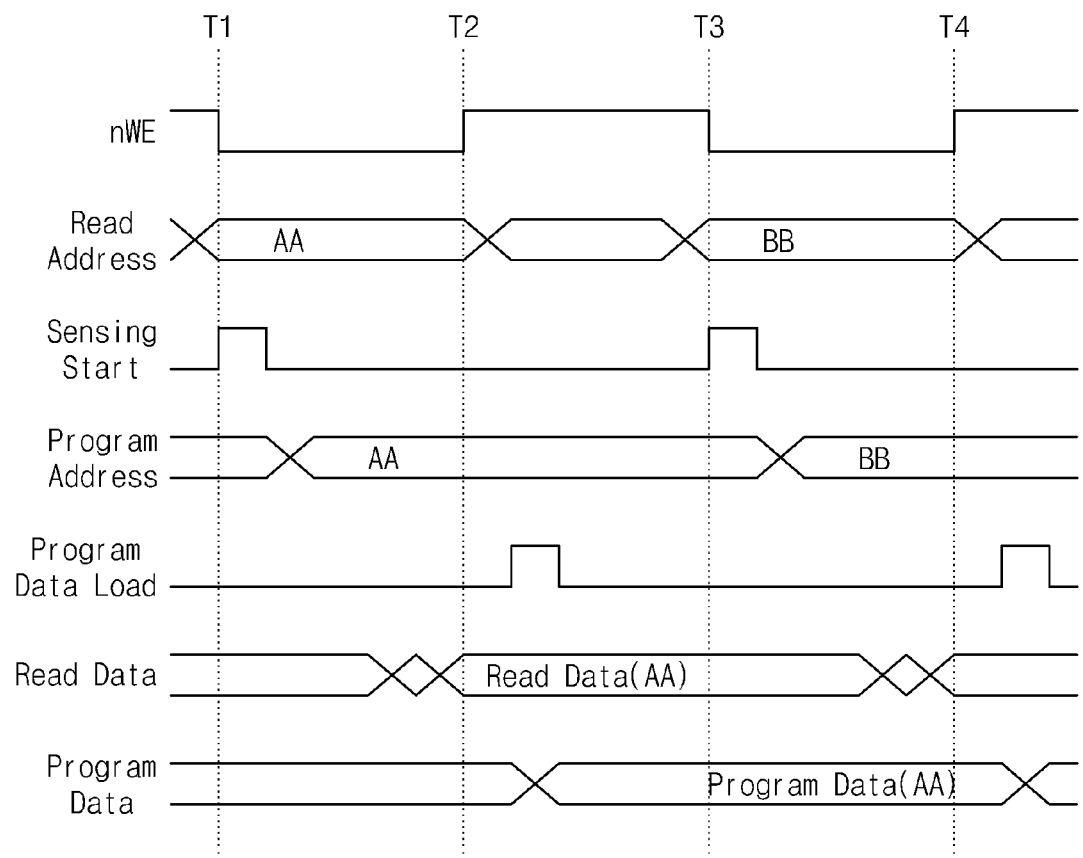
FIG. 3 is a timing diagram illustrating the operation of the control device of FIG. 1 according to an embodiment of the inventive concept.

FIG. 3 is a timing diagram illustrating the operation of the control device of FIG. 1 according to an embodiment of the inventive concept.

Referring to FIG. 3, in an interval T1-T2, in response to a program command is input to the control device, read control circuit 4 outputs a read address signal AA of nonvolatile memory cell array 5, and read control circuit 4 starts the detection of a read data signal. Read address signal AA indicates selected memory cells, and the read data signal corresponds to read data stored in the selected memory cells.

Program control circuit 2 receives program data from an external source and outputs a program address signal AA to buffer circuit 1 at the same time that read address signal AA is output to nonvolatile memory cell array 5. At a time T2, read control circuit 4 detects read data signal AA and transmits the detected signal to buffer circuit 1.

In an interval T2-T3, program control circuit 2 outputs program data signal AA to buffer circuit 1 at a stop time of a program data load signal, and buffer circuit 1 stores the program data. Also within interval T2-T3, the read data is compared with the program data as in the method of FIG. 2, and the program data is subsequently programmed into nonvolatile memory cell array 5.

In an interval T3-T4, an address signal BB corresponding to additional selected memory cells is processed similar to interval T1-T2, and in an interval T4-T6, a program address signal BB is processed similar to interval T2-T4. In other words, the processes of intervals T1-T2 and T3 and T4 are repeated for additional units of program data, similar to the method of FIG. 2.

The control device of FIGS. 1 through 3 can be used to program various types of nonvolatile memory devices, such as NOR flash memory, NAND flash memory, and PRAM, to name but a few.

In the embodiments of FIGS. 1 through 3, a bit of program data can be changed from a '0' to a '1' where a corresponding memory cell is already successfully programmed to a '0'. Thereafter, in a program operation, a program inhibit voltage can be applied to the memory cell so that it is not programmed. Accordingly, in this example, a bit of program data set to '1' is referred to as a program inhibit bit. In other embodiments, a value other than '1' can be used as a program inhibit bit.

The control device causes programming to occur on selected memory cells corresponding to bits of program data that have not been changed to program inhibit bits. Consequently, the control device can reduce the stress on the selected memory cells, which can extend their lifetime or improve their reliability. In addition, the control device reads existing data from a nonvolatile memory cell array at the same time that it transfers program data to a buffer circuit, which can produce a relatively efficient program operation for data retention. Moreover, by not programming some memory cells, the control device may reduce the time to perform certain program operations.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A device, comprising:
    a nonvolatile memory cell array comprising a plurality of memory cells;
    a buffer circuit;
    a read control circuit that reads data from a selected address of the nonvolatile memory cell array and transfers the read data from the buffer circuit;
    a program control circuit that stores program data in the buffer circuit, compares the program data with the read data, and sets a bit of the program data as a program-inhibit bit based on the comparison.

2. The device of claim 1, wherein the program control circuit sets the bit of the program data as a program-inhibit bit upon detecting that a corresponding bit of the read data has a state corresponding to a programmed memory cell.

3. The device of claim 1, wherein the program control circuit performs a program operation to store the program data at the selected address of the nonvolatile memory cell array after setting the bit of the program data as the program-inhibit bit.

4. The device of claim 3, wherein the program control circuit disables a program voltage corresponding to the program-inhibit bit in the program operation.

5. The device of claim 3, further comprising:
    a verify control circuit that reads the program data from the selected address to determine whether the program data is successfully stored in the selected address.

6. The nonvolatile memory control device of claim 5, wherein the verify control circuit reads the program data from the selected address using a voltage higher than a read voltage used in normal read operations of the nonvolatile memory cell array.

7. The device of claim 3, wherein the program operation is performed using incremental step pulse programming.

8. The device of claim 1, wherein the program-inhibit bit corresponds to a logical '1'.

9. The device of claim 1, wherein the read control circuit reads data from the nonvolatile memory cell array while the program control circuit stores the program data in the buffer circuit.

10. A device, comprising:
    a read control circuit that reads data from a selected address of a nonvolatile memory cell array and stores the read data in a buffer; and
    a program control circuit that stores program data in the buffer while the read control circuit reads the read data from the nonvolatile memory cell array, compares the program data stored in the buffer with the read data stored in the buffer, and changes a bit of the program data to a program-inhibit bit based on the comparison.

11. The device of claim 10, further comprising:
    a verify control circuit that performs a verify read operation to verify whether the data stored at the selected address matches the program data, and causes the program control circuit to program the program data to the selected address upon determining that the data stored at the selected address does not match the program data.

12. The device of claim 11, wherein the verify control circuit reads the written program data with a verification voltage higher than a read voltage used in normal read operations of the nonvolatile memory cell array.

13. The device of claim 10, wherein the nonvolatile memory cell array is a NAND flash memory cell array.

14. A method of operating a control device for a nonvolatile memory device, the method comprising:
    reading data from a selected address of a nonvolatile memory cell array and storing the read data in a buffer;
    storing program data in the buffer while the data is read from the nonvolatile memory cell array;
    setting a bit of the program data as a program-inhibit bit upon detecting that the bit has a different value from a corresponding bit of the read data; and
    performing a program operation to store the program data having the program-inhibit bit at the selected address of the nonvolatile memory cell array.

15. The method of claim 14, further comprising:
    reading the program data from the nonvolatile memory cell array;
    inhibiting further programming of bits of the program data that have been successfully programmed at the selected address; and
    further programming bits of the program data that have not been successfully programmed at the selected address.

16. The method of claim 15, wherein reading the program data from the nonvolatile memory cell array comprises applying a verification read voltage to selected memory cells of the nonvolatile memory cell array, wherein the verification read voltage is higher than a read voltage applied to the selected memory cells during normal read operations of the nonvolatile memory cell array.

17. The method of claim 14, wherein the program data is stored in the nonvolatile memory cell array using an incremental step pulse programming operation.

18. The method of claim 14, wherein the nonvolatile memory cell array is a NAND flash memory device.

19. The method of claim 14, further comprising incrementing the selected address, storing additional program data in the buffer, reading additional data from the nonvolatile memory cell array at the incremented address, comparing the additional read data to the additional program data, and changing a bit of the additional program data to a program-inhibit bit based on the comparison.

20. The method of claim 14, wherein the program-inhibit bit is a logical '1'.

* * * * *